(12) United States Patent
Tsao

(10) Patent No.: US 10,612,631 B2
(45) Date of Patent: Apr. 7, 2020

(54) INTEGRATED CIRCUIT CHIP PROGRAMMING APPARATUS

(71) Applicant: Dediprog Technology Co., Ltd., Taipei (TW)

(72) Inventor: Chong-Yung Tsao, Taipei (TW)

(73) Assignee: DEDIPROG TECHNOLOGY CO., LTD., Taipei (TW)

( * ) Notice: Subject to any disclaimer, the term of this patent is extended or adjusted under 35 U.S.C. 154(b) by 181 days.

(21) Appl. No.: 15/869,408

(22) Filed: Jan. 12, 2018

(65) Prior Publication Data

US 2019/0162279 A1    May 30, 2019

(30) Foreign Application Priority Data

Nov. 24, 2017   (TW) .............................. 106217534 U

(51) Int. Cl.

| F16H 21/44 | (2006.01) |
|---|---|
| H01H 21/02 | (2006.01) |
| H01L 21/67 | (2006.01) |
| G06F 8/60 | (2018.01) |
| G06F 30/00 | (2020.01) |

(52) U.S. Cl.
CPC .............. *F16H 21/44* (2013.01); *G06F 8/60* (2013.01); *G06F 30/00* (2020.01); *H01L 21/67092* (2013.01)

(58) Field of Classification Search
CPC .......... F16H 21/02; F16H 21/10; F16H 21/12; F16H 21/44; H01L 21/67005; H01L 21/67092; H01L 21/673
See application file for complete search history.

(56) References Cited

U.S. PATENT DOCUMENTS

| 2015/0348807 A1* | 12/2015 | Huang .............. H01L 21/67092 29/25.01 |
|---|---|---|
| 2019/0128950 A1* | 5/2019 | Mardi .................. G01R 31/045 |

\* cited by examiner

*Primary Examiner* — Adam D Rogers
(74) *Attorney, Agent, or Firm* — Kirton McConkie; Evan R. Witt

(57) ABSTRACT

The integrated circuit chip programming apparatus comprises a fixing device, an actuating device and a flexible device. The fixing device comprises a supporting part and a cover. One end of the cover is coupled with one end of the supporting part and comprises an accommodation space for accommodating a chip therein. The cover selectively covers or uncovers the supporting part so as to close or expose the accommodation space. The flexible device is coupled between the fixing device and the actuating device. When a force is against the forced end, the actuating device is rotated to drive the cover to expose the accommodation space. When no force is against the forced end or the force against the forced end is stopped, the flexible device provides a recovery force to allow the actuating device to rotate to drive the cover to close the accommodation space of the supporting part.

10 Claims, 8 Drawing Sheets

INTEGRATED CIRCUIT CHIP PROGRAMMING APPARATUS

CROSS-REFERENCE TO RELATED APPLICATION

This application claims priority to Taiwan Patent Application No. 106217534 filed on Nov. 24, 2017, the entire contents of which are incorporated herein by reference for all purposes.

FIELD OF THE INVENTION

The present disclosure relates to an integrated circuit chip programming apparatus, and more particularly to a foldable integrated circuit chip programming apparatus capable of opening the cover thereof when a force is against the integrated circuit chip programming apparatus.

BACKGROUND OF THE INVENTION

With increasing development of the electronic product, the requirement of the chip within the electronic device is gradually increased. Before the chip is mounted on the electronic device, the chip must be programmed. Namely, the chip is disposed and fixed within the interior of an integrated circuit chip programming apparatus, and then a pre-definition program is written into the chip by a pin within the integrated circuit chip programming apparatus, so that the chip is programmed and possesses the function of controlling the other element of the electronic device.

At present, according to the accommodation way of the chip, the integrated circuit chip programming apparatus can be roughly classified into two types, i.e. pressing-type integrated circuit chip programming apparatus and foldable-type integrated circuit chip programming apparatus. The pressing-type integrated circuit chip programming apparatus comprises a plurality of grapping arms. When the pressing-type integrated circuit chip programming apparatus is pressed in a specific position thereof, the grapping arms rise and expand, and the chip can be loaded between the grapping arms. Then, the pressing action upon the pressing-type integrated circuit chip programming apparatus is stopped, and the grapping arms are closed accordingly. Consequently, the chip is fixed within the interior of the pressing-type integrated circuit chip programming apparatus by the grapping arms.

Due to that the pressing-type integrated circuit chip programming apparatus employs grapping arms to fix the chip within the interior thereof, the pin used to contact with the chip must be longer. In other words, the pressing-type integrated circuit chip programming apparatus must employ specific pin, which is hard to be produced and may increase the cost. Consequently, the pressing-type integrated circuit chip programming apparatus fails to be produced in mass. In addition, the pressing-type integrated circuit chip programming apparatus normally has worse yield.

The foldable-type integrated circuit chip programming apparatus comprises a base and a cover. The cover is configured to cover or uncover the base. When a force in a first direction is against the cover, the cover can be detached from the base. Under this circumstance, the chip can be loaded on the base. When a force in a second direction opposite to the first direction is against the cover, the cover can cover the base. Under this circumstance, the cover fix the chip within the base. Consequently, the programming operation of the chip can be performed by the foldable-type integrated circuit chip programming apparatus. Comparing with the pressing-type integrated circuit chip programming apparatus, the foldable-type integrated circuit chip programming apparatus needn't employ the specific pin and has better yield. However, before the programming operation of the chip is performed by the foldable-type integrated circuit chip programming apparatus, the forces are needed for performing the close and open operation of the cover and the base. If the foldable-type integrated circuit chip programming apparatuses are employed to program the chips automatically, a plurality of forcing devices need to be added to cooperate with corresponding integrated circuit chip programming apparatuses, so that the forces against the foldable-type integrated circuit chip programming apparatuses can be provided. Consequently, the cost may increase and the programming operation is complex.

Therefore, there is a need of providing an integrated circuit chip programming apparatus in order to overcome the above drawbacks.

BRIEF SUMMARY OF THE INVENTION

The present disclosure provides an integrated circuit chip programming apparatus in order to simplify produce, enhance yield and reduce the fabricating cost.

In accordance with an aspect of the present disclosure, there is provided an integrated circuit chip programming apparatus disposed on a platform and configured to program a chip. The integrated circuit chip programming apparatus comprises a fixing device, an actuating device and a flexible device. The fixing device comprises a supporting part and a cover. The supporting part is stationary disposed on the platform and comprises an accommodation space for accommodating the chip therein. One end of the cover is coupled with one end of the supporting part to form a first rotating pivot, and the cover is rotated relative to the supporting part around the first rotating pivot, so that the cover selectively covers or uncovers the supporting part to close or expose the accommodation space of the supporting part. The actuating device comprises a first connection end, a second connection end and a forced end. The first connection end is coupled with the cover. The second connection end is coupled with the supporting part to form a second rotating pivot. The actuating device is rotated relative to the supporting part around the second rotating pivot. When a force is against the forced end, the actuating device is rotated relative to supporting part to drive the cover to expose the accommodation space of the supporting part. The flexible device is connected between the fixing device and the actuating device. When no force is against the forced end or the force against the forced end is stopped, the flexible device provides a recovery force to allow the actuating device to rotate relative to the supporting part to drive the cover to close the accommodation space of the supporting part.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
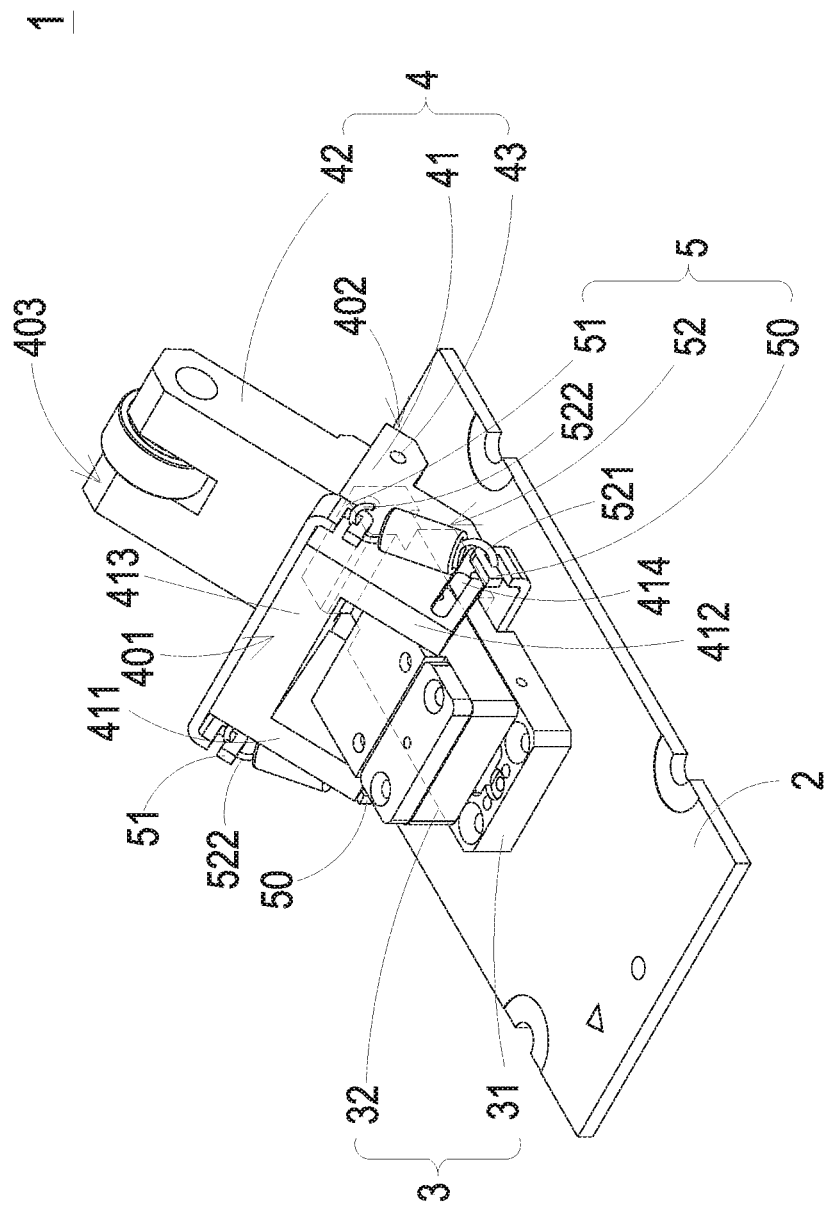
FIG. 1 is a schematic perspective view illustrating an integrated circuit chip programming apparatus according to a first embodiment of the present invention.
Figure 2:
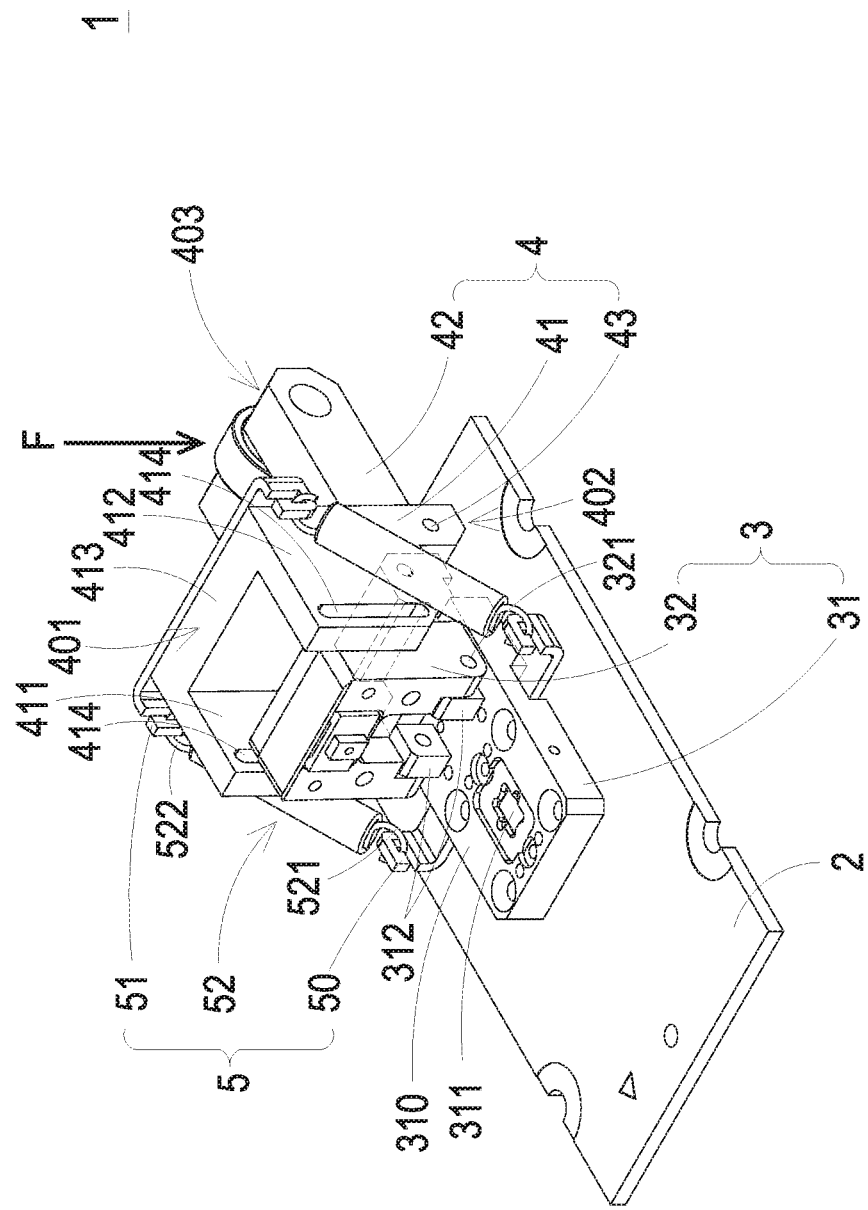
FIG. 2 is a schematic perspective view illustrating the open operation of a cover and a supporting part of the integrated circuit chip programming apparatus of FIG. 1.
Figure 3:
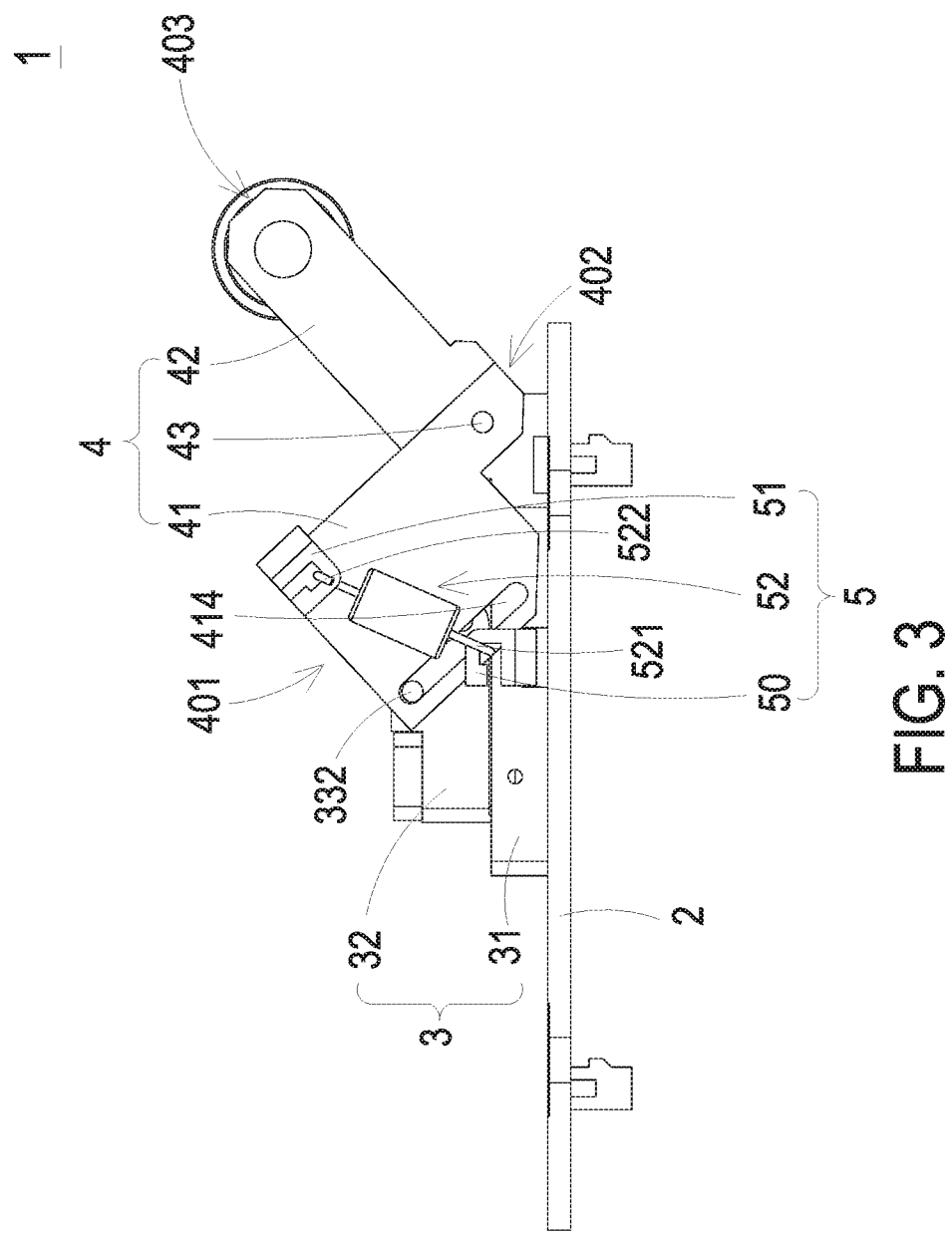
FIG. 3 is a schematic cross-sectional view illustrating the close operation of the cover and the supporting part of the integrated circuit chip programming apparatus of FIG. 1.
Figure 4:
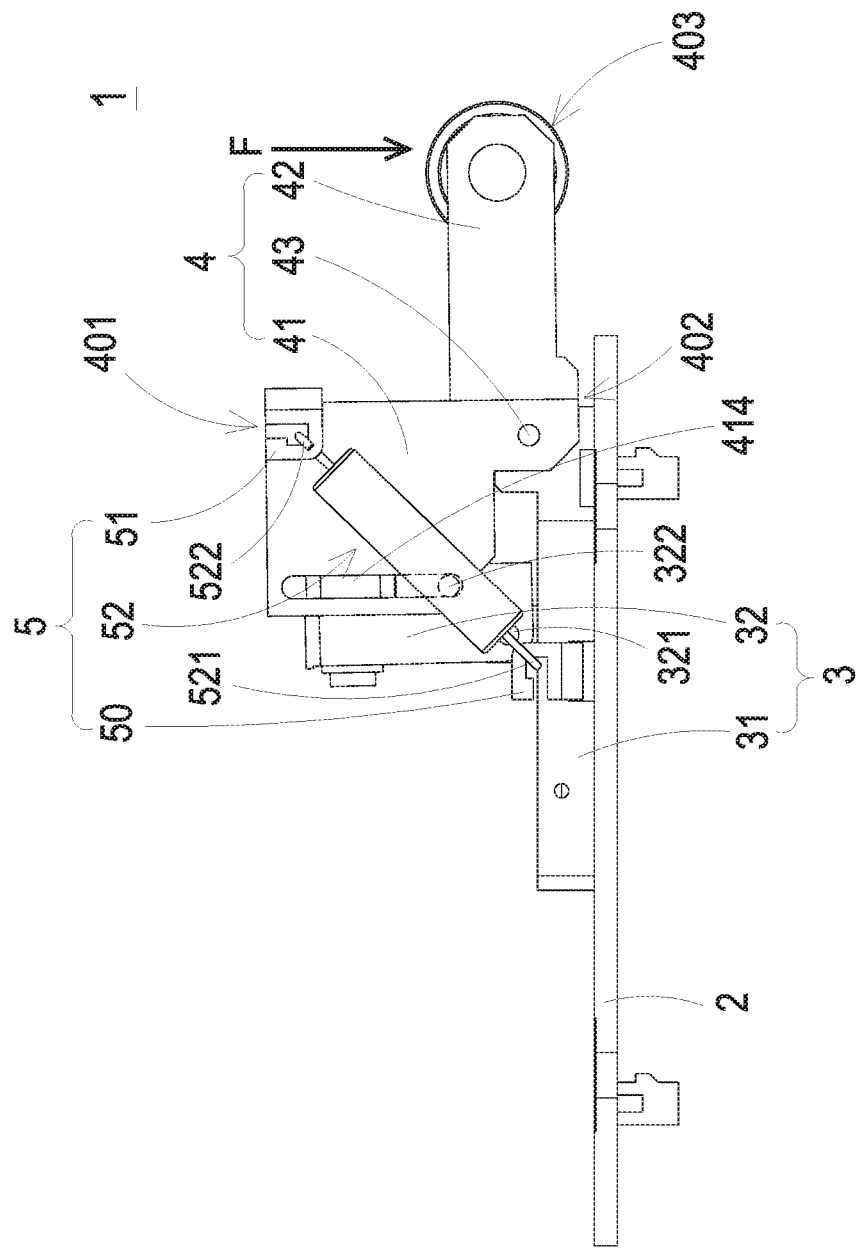
FIG. 4 is a schematic cross-sectional view illustrating the open operation of the cover and the supporting part of the integrated circuit chip programming apparatus of FIG. 1.

FIG. 1 is a schematic perspective view illustrating an integrated circuit chip programming apparatus according to a first embodiment of the present invention, FIG. 2 is a schematic perspective view illustrating the open operation of a cover and a supporting part of the integrated circuit chip programming apparatus of FIG. 1, FIG. 3 is a schematic cross-sectional view illustrating the close operation of the cover and the supporting part of the integrated circuit chip programming apparatus of FIG. 1, and FIG. 4 is a schematic cross-sectional view illustrating the open operation of the cover and the supporting part of the integrated circuit chip programming apparatus of FIG. 1. As shown in FIGS. 1, 2, 3 and 4, the integrated circuit chip programming apparatus 1 is disposed on a platform 2 and configured to program a chip (not shown). The integrated circuit chip programming apparatus 1 comprises a fixing device 3, an actuating device 4 and a flexible device 5. The fixing device 3 is coupled with the actuating device 4, and the fixing device 3 is configured to mount and fix the chip for performing a programming operation with respect to the chip. The fixing device 3 comprises a supporting part 31 and a cover 32. The supporting part 31 is stationary disposed on the platform 2. The supporting part 31 comprises a top surface 310 and an accommodation space 311 concavely formed on the top surface 310 for accommodating the chip therein. Namely, the supporting part 31 has a concave structure. The cover 32 can selectively cover or uncover the supporting part 31 so as to close or expose the accommodation space 311. One end of the cover 32 is coupled with one end of the supporting part 31 to form a first rotating pivot. Namely, the interconnection portion between the cover 32 and the supporting part 31 is formed as a first rotating pivot. The cover 32 is rotated relative to the supporting part 31 around the first rotating pivot, so that the cover 32 selectively covers or uncovers the supporting part 31. When the cover 32 uncovers the supporting part 31 (as shown in FIGS. 2 and 4), the accommodation space 311 of the supporting part 31 is exposed, so that the chip can be disposed within the accommodation space 311 of the supporting part 31. After the chip is disposed within the accommodation space 311 and when the cover 32 covers the supporting part 31, the accommodation space 311 of the supporting part 31 is closed by the cover 32 (as shown in FIGS. 1 and 3) and the chip is fixed within the accommodation space 311 at the same time. Consequently, the chip is programmed by the integrated circuit chip programming apparatus 1.

The actuating device 4 comprises a first connection end 401, a second connection end 402 and a forced end 403. The first connection end 401 is coupled with the cover 32 of the fixing device 3. The second connection end 402 is coupled with the supporting part 31 of the fixing device 3. The interconnection portion between the second connection end 402 and the supporting part 31 is formed as a second rotating pivot. The actuating device 4 is rotated relative to the supporting part 31 around the second rotating pivot. When a force F is against the forced end 403 (as shown in FIGS. 2 and 4) or no force is against the forced end 403 (as shown in FIGS. 1 and 3), the actuating device 4 is rotated relative to the supporting part 31 around the second rotating pivot. Due to that the first connection end 401 is coupled with the cover 32, the actuating device 4 drives the cover 32 to uncover or cover the supporting part 31. When the force F is against the forced end 403, the actuating device 4 is rotated relative to the supporting part 31 around the second rotating pivot in a first direction, the actuating device 4 drives the cover 32 to uncover the supporting part 31 so as to expose the accommodation space 311 of the supporting part 31. Otherwise, when no force is against the forced end 403 or the force F against the forced end 403 is stopped, the actuating device 4 is rotated relative to the supporting part 31 around the second rotating pivot in a second direction opposite to the first direction, the actuating device 4 drives the cover 32 to cover the supporting part 31 so as to close the accommodation space 311 of the supporting part 31.

The flexible device 5 is connected between the fixing device 3 and the actuating device 4. When no force is against the forced end 403 or the force F against the forced end 403 is stopped, the flexible device 5 provides a recovery force to allow the actuating device 4 to rotate relative to the supporting part 31 in the second direction so as to drive the cover 32 to cover the supporting part 31. Consequently, the cover 32 closes the accommodation space 311 of the supporting part 31.

From the above description, the integrated circuit chip programming apparatus 1 is a foldable-type integrated circuit chip programming apparatus comprising the cover 32. Comparing with the traditional pressing integrated circuit chip programming apparatus, the inventive integrated circuit chip programming apparatus 1 is unnecessary to employ a specific pin and has better yield. Moreover, if a plurality of integrated circuit chip programming apparatuses 1 are employed to program the chips automatically and simultaneously, a force F is against the actuating devices 4 of the integrated circuit chip programming apparatuses 1 to drive the covers 32 to uncover the supporting parts 31. Otherwise, when no force is against the actuating devices 4 or the force F against the actuating devices 4 is stopped, the actuating devices 4 drive the covers 32 to rotate relative to the supporting parts 31 by the flexible devices 5 so as to cover the supporting parts 31. Therefore, before the programming operation of the chip is performed by the inventive integrated circuit chip programming apparatus 1, a force is needed for performing the open operation of the cover 32 and the supporting part 31, but no force is needed for performing the close operation of the cover 32 and the supporting part 31. If a plurality of integrated circuit chip programming apparatuses 1 are employed to program the chips automatically, no additional forcing device is needed to cooperate with the integrated circuit chip programming apparatuses 1. Consequently, the cost is reduced, and the programming operation is simplified.

In some embodiments, as shown in FIG. 2, the cover 32 comprises a first shaft part 321. The supporting part 31 comprises a first shaft part 312. The first shaft part 321 of the cover 32 is pivotally connected with the first shaft part 312 of the supporting part 31 to form the first rotating pivot. Namely, the interconnection between the cover 32 and the supporting part 31 is formed as the first rotating pivot. The cover 32 is rotated relative to the supporting part 31 around the first shaft part 321 of the cover 32 and the first shaft part 312 of the supporting part 31 to cover or uncover the supporting part 31 so as to close or expose the accommodation space 311 of the supporting part 31.

In addition, the actuating device 4 comprises a first portion 41, a second portion 42 and a linking shaft portion 43. One end of the first portion 41 is coupled with the cover 32, so that one end of the first portion 41 is configured as the first connection end 401. The other end of the first portion 41 is coupled with one end of the second portion 42 and the supporting part 31, so that the interconnection between the other end of the first portion 41 and one end of the second portion 42 is configured as the second connection end 402. The first portion 41 is coupled with the second portion 42, preferably but not exclusively, the actuating device 4 is an L-shaped structure. The other end of the second portion 42 is configured as the force end 403. The linking shaft portion 43 is pivotally connected with a third shaft part (not shown) of the supporting part 31 to form the second rotating pivot. Namely, the linking shaft portion 43 is located at the interconnection between first portion 41 and the second portion 42, and the interconnection among the first portion 41, the second portion 42 and the supporting part 31 is formed as the second rotating pivot. Consequently, the first portion 41 and the second portion 42 link with each other and are rotated relative to the supporting part 31 around the linking shaft portion 43 and the third shaft part of the supporting part 31. When the force F is against the second portion 42, the second portion 42 drives the first portion 41 coupled with the second portion 42 to rotate in the first direction synchronously. Under this circumstance, the first portion 41 drives the cover 32 coupled with the first portion 4 to rotate relative to the supporting part 31 around the first shaft part 321 and the first shaft part 312 to uncover the supporting part 31, so that the accommodation space 311 is exposed and the chip can be loaded in the accommodation space 311 of the supporting part 31. Thereafter, when the force F against the second portion 42 is stopped, the flexible device 5 connected between the fixing device 3 and the actuating device 4 provides the recovery force to drive the first portion 41 and the second portion 42 to rotate relative to the supporting part 31 in the second direction opposite to the first direction. Consequently, the first portion 41 drives the cover 32 to rotate relative to the supporting part 31 around the first shaft part 321 and the first shaft part 312 and move toward to the direction of covering the supporting part 31 so as to close the accommodation space 311 of the supporting part 31.

In some embodiments, the first portion 41 of the actuating device 4 comprises a first sidewall 411, a second sidewall 412 and a third sidewall 413. The first sidewall 411 is opposite to the second sidewall 412. The third sidewall 413 is connected and disposed between the first sidewall 411 and the second sidewall 412. The first sidewall 411, the second sidewall 412 and the third sidewall 413 collectively form a groove structure. The groove structure is configured to receive at least portion of the cover 32.

In some embodiments, each of the first sidewall 411 and the second sidewall 412 comprises an elongated sliding slot 414. In addition, as shown in FIGS. 3 and 4, the cover 32 comprises a second shaft part 322 correspondingly. The second shaft part 322 is pivotally connected with the interconnection between the cover 32 and first portion 41. The opposite two ends of the second shaft part 322 are respectively and slidably disposed in the corresponding elongated sliding slot 414. The opposite two ends of the second shaft part 322 and the elongated sliding slot 414 form a cam structure. When the force F is against the forced end 403 of the actuating device 4 to drive the cover 32 to uncover the supporting part 31 so as to expose the accommodation space 311, or no force is against the forced end 403 or the force F against the forced end 403 is stopped to drive the cover 32 to cover the supporting part 31 so as to close the accommodation space 311, the opposite two ends of the second shaft part 322 are correspondingly and slidably disposed in the elongated sliding slots 414. Hence, in the case that the force F is against the forced end 403 to drive the second portion 42 to be rotated by a smaller angle, the cover 32 is rotated by a larger angle and moves toward a direction of uncovering the supporting part 31. For example, when the force F is against the forced end 403 to drive the second portion 42 to rotate in the first direction and the rotating angle between the forced end 403 and the second portion 42 is 50 degrees, the cover 32 uncovers the supporting part 31 and the rotating angle between the cover 32 and the supporting part 31 is 90 degrees. In other words, in the case that small force F is against the forced end 403, the cover 32 uncovers the supporting part 31 by larger angle.

In the above embodiments, the flexible device 5 comprises at least one first hook part 50, at least one second hook part 51 and at least one flexible element 52. As shown in FIG. 1, the two first hook parts 50 are respectively disposed on the opposite two sides of the supporting part 31. The two second hook parts 51 are disposed on the first sidewall 411 of the first portion 41 and the second sidewall 412 of the first portion 41 respectively. Preferably but not exclusively, the two flexible elements 52 are extension springs. Each flexible element 52 comprises a third hook part 521 and a fourth hook part 522. The third hook part 521 and the fourth hook part 522 are disposed on the opposite two ends of the corresponding flexible element 52 respectively. Each third hook part 521 is engaged with the corresponding first hook part 50. Each fourth hook part 522 is engaged with the corresponding second hook part 51. Therefore, in the case that the force F is against the second portion 42 to drive the cover 32 to uncover the supporting part 31, once the force F against the forced end 403 is stopped, the flexible element 52 provides the recovery force to drive the first portion 41 and the second portion 42 to rotate in the second direction, so that the flexible element 52 drives the cover 32 coupled with the first portion 41 to cover the supporting part 31.

Figure 5:
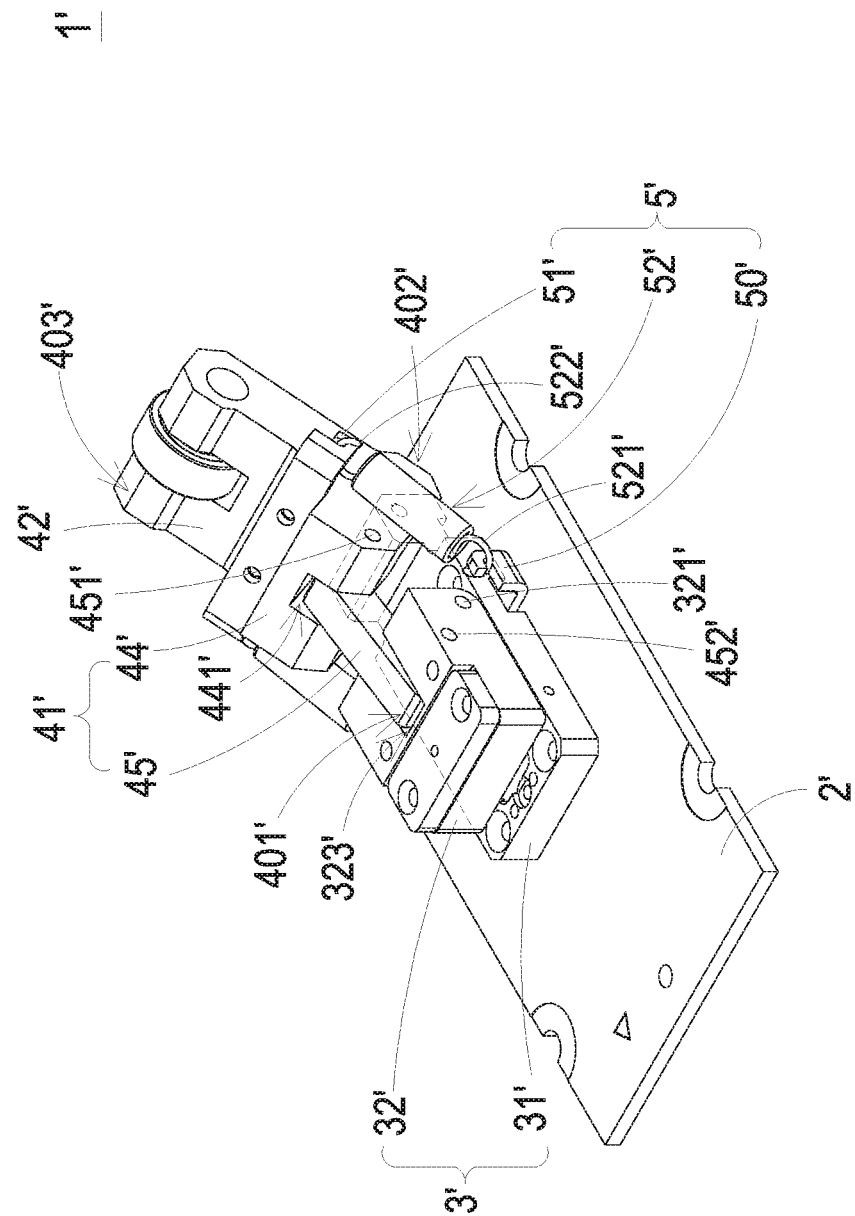
FIG. 5 is a schematic perspective view illustrating an integrated circuit chip programming apparatus according to a second embodiment of the present invention.
Figure 6:
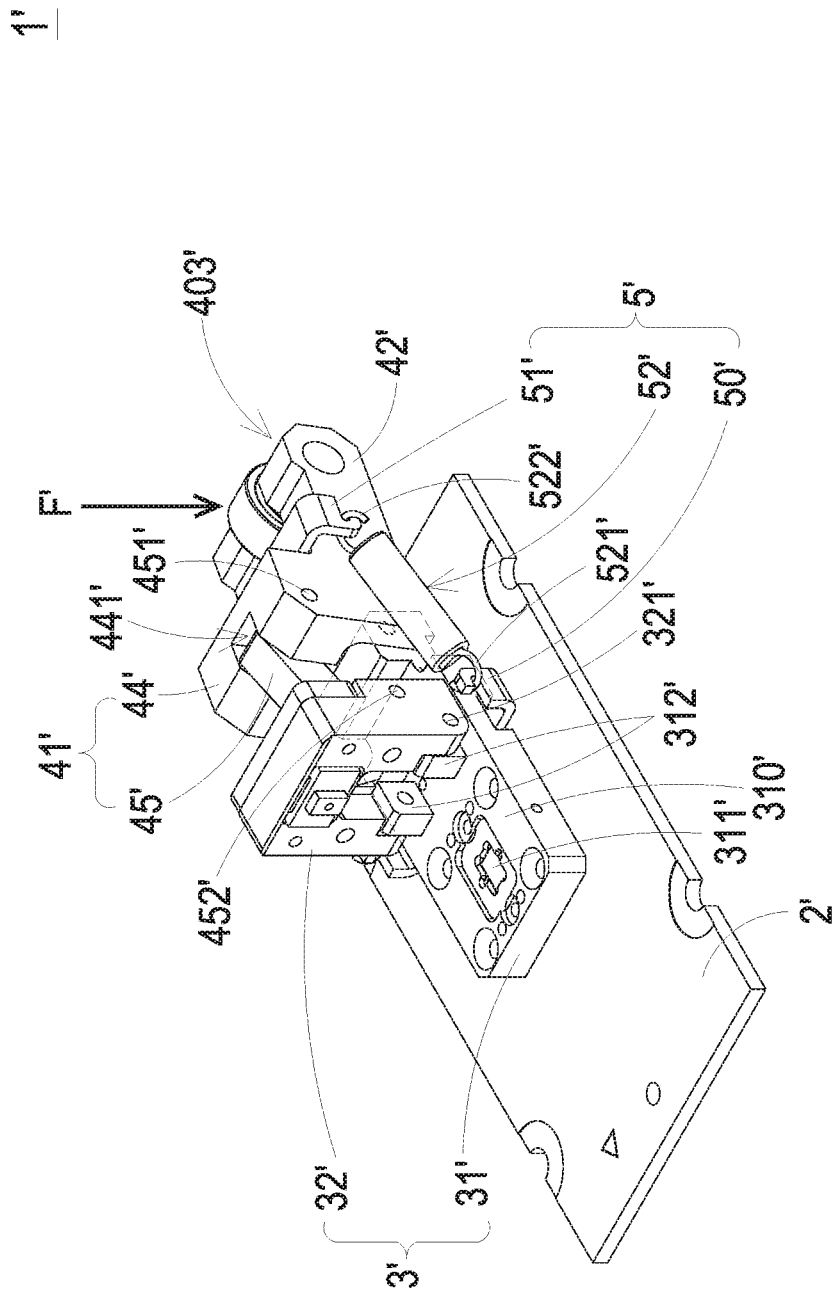
FIG. 6 is a schematic perspective view illustrating the open operation of a cover and a supporting part of the integrated circuit chip programming apparatus of FIG. 5.
Figure 7:
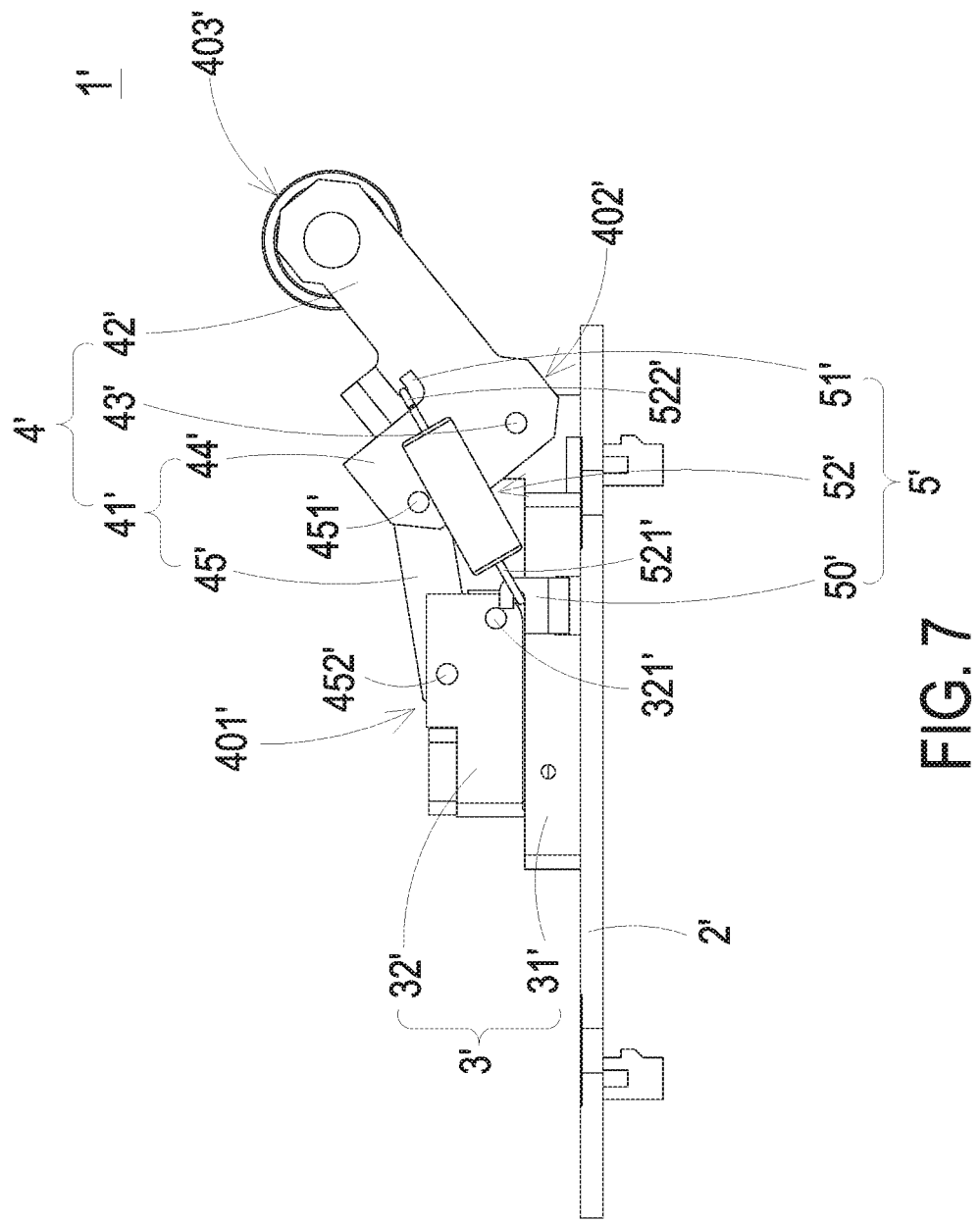
FIG. 7 is a schematic cross-sectional view illustrating the close operation of the cover and the supporting part of the integrated circuit chip programming apparatus of FIG. 5.
Figure 8:
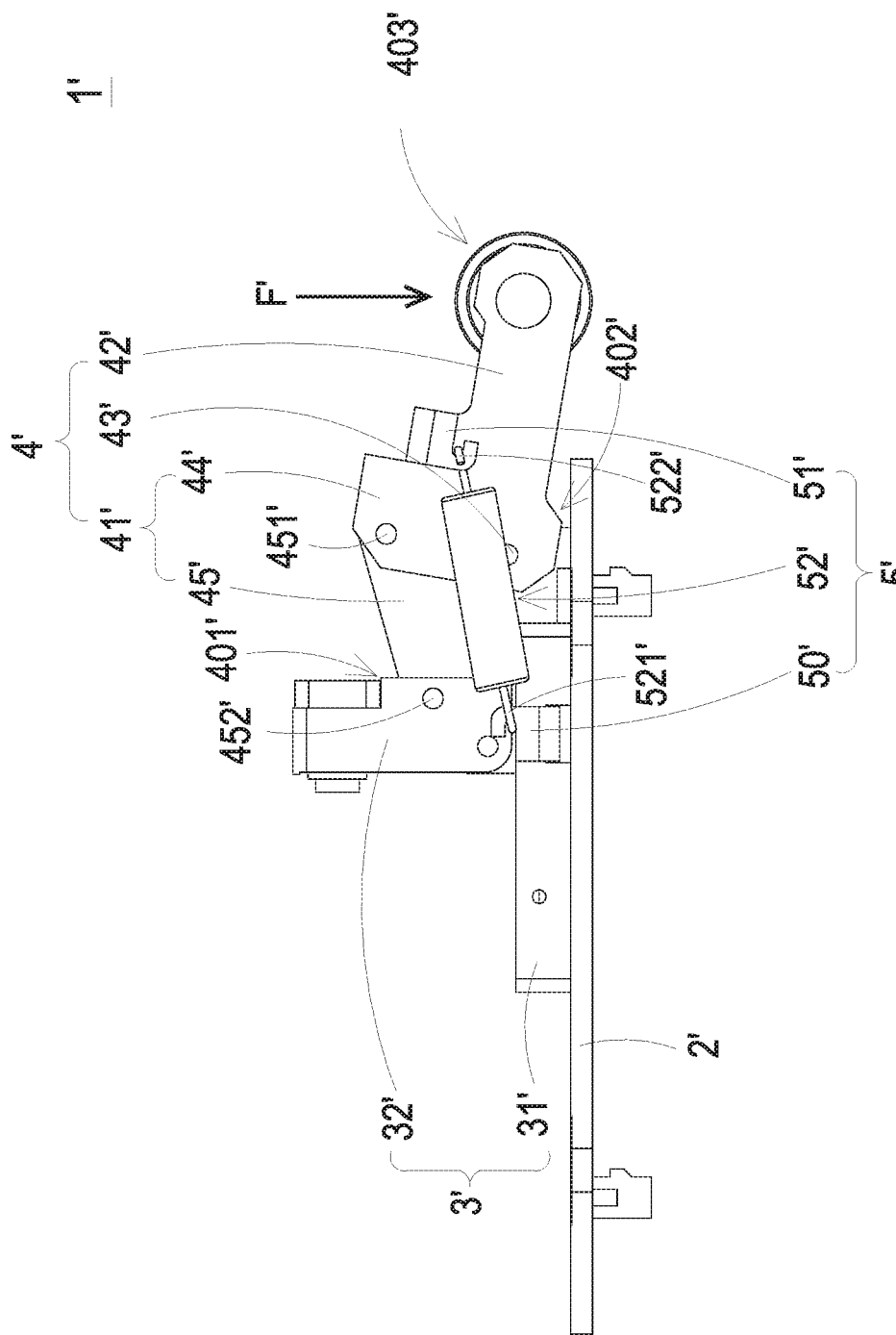
FIG. 8 is a schematic cross-sectional view illustrating the open operation of the cover and the supporting part of the integrated circuit chip programming apparatus of FIG. 5.

FIG. 5 is a schematic perspective view illustrating an integrated circuit chip programming apparatus according to a second embodiment of the present invention, FIG. 6 is a schematic perspective view illustrating the open operation of a cover and a supporting part of the integrated circuit chip programming apparatus of FIG. 5, FIG. 7 is a schematic cross-sectional view illustrating the close operation of the cover and the supporting part of the integrated circuit chip programming apparatus of FIG. 5, and FIG. 8 is a schematic cross-sectional view illustrating the open operation of the cover and the supporting part of the integrated circuit chip programming apparatus of FIG. 5. As shown in FIGS. 5, 6, 7 and 8, the integrated circuit chip programming apparatus 1' is disposed on a platform 2' and configured to program a chip (not shown). The integrated circuit chip programming apparatus 1' comprises a fixing device 3', an actuating device 4' and a flexible device 5'. The fixing device 3' is coupled with the actuating device 4', and the fixing device 3 is configured to mount and fix the chip for performing a programming operation with respect to the chip. The fixing device 3' comprises a supporting part 31' and a cover 32'. The supporting part 31' is stationary disposed on the platform 2'. The supporting part 31' comprises a top surface 310' and an accommodation space 311' concavely formed on the top surface 310 for accommodating the chip therein. Namely, the supporting part 31' has a concave structure. The cover 32' can selectively cover or uncover the supporting part 31' so as to close or expose the accommodation space 311'. One end of the cover 32' is coupled with one end of the supporting part 31' to form a first rotating pivot. Namely, the interconnection portion between the cover 32' and the supporting part 31' is formed as a first rotating pivot. The cover 32' is rotated relative to the supporting part 31' around the first rotating pivot, so that the cover 32' selectively covers or uncovers the supporting part 31'. When the cover 32' uncovers the supporting part 31' (as shown in FIGS. 6 and 8), the accommodation space 311' of the supporting part 31' is exposed, so that the chip can be disposed within the accommodation space 311' of the supporting part 31'. After the chip is disposed within the accommodation space 311 and when the cover 32' covers supporting part 31, the accommodation space 311' of the supporting part 31' is closed by the cover 32' (as shown in FIGS. 5 and 7) and the chip is fixed within the accommodation space 311' at the same time. Consequently, the chip is programmed by the integrated circuit chip programming apparatus 1'.

In some embodiments, the cover 32' comprises a first shaft part 321'. The supporting part 31' comprises a first shaft part 312'. The first shaft part 321' of the cover 32' is pivotally connected with the first shaft part 312' of the supporting part 31' to form the first rotating pivot. Namely, the interconnection between the cover 32' and the supporting part 31' is formed as the first rotating pivot. The cover 32' is rotated relative to the supporting part 31' around the first shaft part 321' of the cover 32' and the first shaft part 312' of the supporting part 31' to cover or uncover the supporting part 31' so as to close or expose the accommodation space 311' of the supporting part 31'.

The actuating device 4' comprises a first connection end 401', a second connection end 402' and a forced end 403'. The first connection end 401' is coupled with the cover 32' of the fixing device 3'. The second connection end 402' is coupled with the supporting part 31' of the fixing device 3'. The interconnection portion between the second connection end 402' and the supporting part 31' is formed as a second rotating pivot. The actuating device 4' is rotated relative to the supporting part 31' around the second rotating pivot. When the a force F' is against forced end 403' (as shown in FIGS. 6 and 8) or no force is against the forced end 403' (as shown in FIGS. 5 and 7), the actuating device 4' is rotated relative to the supporting part 31' around the second rotating pivot. Due to that the first connection end 401' is coupled with the cover 32', the actuating device 4' drives the cover 32' to uncover or cover the supporting part 31'. When the force F' is against the forced end 403', the actuating device 4' is rotated relative to the supporting part 31' around the second rotating pivot in a first direction, the actuating device 4 drives the cover 32' to uncover or uncover the supporting part 31' so as to expose the accommodation space 311' of the supporting part 31'. Otherwise, when no force is against the forced end 403' or the force F' against the forced end 403' is stopped, the actuating device 4' is rotated relative to the supporting part 31' around the second rotating pivot in a second direction opposite to the first direction, the actuating device 4' drives the cover 32' so as to cover the supporting part 31' to close the accommodation space 311' of the supporting part 31'.

The flexible device 5' is connected between the fixing device 3' and the actuating device 4'. When no force is against the forced end 403' or the force F' against the forced end 403' is stopped, the flexible device 5' provides a recovery force to allow the actuating device 4' to rotate relative to the supporting part 31' in the second direction so as to drive the cover 32' to cover the supporting part 31'. Consequently, the cover 32 closes the accommodation space 311' of the supporting part 31'.

From the above description, the integrated circuit chip programming apparatus 1' is a foldable-type integrated circuit chip programming apparatus comprising the cover 32'. Comparing with the traditional pressing integrated circuit chip programming apparatus, the inventive integrated circuit chip programming apparatus 1' is unnecessary to employ a specific pin and has better yield. Moreover, if a plurality of integrated circuit chip programming apparatuses 1' are employed to program the chips automatically and simultaneously, a force F' is against the actuating devices 4' of the integrated circuit chip programming apparatuses 1' to drive the covers 32' to uncover the supporting parts 31'. Otherwise, when no force is against the actuating devices 4' or the force F' against the actuating devices 4' is stopped, the actuating devices 4' drive the covers 32' to rotate relative to the supporting parts 31 by the flexible devices 5 so as to the supporting parts 31'. Therefore, before the programming operation of the chip is performed by the inventive integrated circuit chip programming apparatus 1', a force is needed for performing the open operation of the cover 32' and the supporting part 31', but no force is needed for performing the close operation of the cover 32' and the supporting part 31'. If a plurality of integrated circuit chip programming apparatuses 1' are employed to program the chips automatically, no additional forcing device is needed to cooperate with the integrated circuit chip programming apparatuses 1'. Consequently, the cost is reduced, and the programming operation is simplified.

In addition, the actuating device 4' comprises a first portion 41', a second portion 42' and a linking shaft portion 43'. The first portion 41' comprises a main body 44' and a linkage 45'. One end of the main body 44' is coupled with one end of the second portion 42' and the supporting part 31', so that the interconnection of one end of the main body 44' and one end of the second portion 42' is configured as the second connection end 402'. One end of the linkage 45' is coupled with the cover 32'. The other end of the linkage 45' is coupled with the other end of the main body 44'. The interconnection between the cover 32' and one end of the linkage 45' is configured as the first connection end 401'. The other end of the second portion 42' is configured as the force end 403'. In addition, as shown in FIGS. 7 and 8, the linking shaft portion 43' is pivotally connected with a third shaft part (not shown) of the supporting part 31' to form the second rotating pivot. Namely, the linking shaft portion 43' is located at the interconnection between the main body 44' and the second portion 42', and the interconnection among the first portion 41', the second portion 42' and the supporting part 31'. Consequently, the main body 44' and the second portion 42' link with each other and are rotated relative to the supporting part 31' around the linking shaft portion 43' of the actuating device 4' and the third shaft part of the supporting part 31'. When the force F' is against the second portion 42', the second portion 42' drives the main body 44' coupled with the second portion 42' to rotate in the first direction synchronously. Under this circumstance, the main body 44' drives the linkage 45' to drive the cover 32' coupled with the linkage 45' of the first portion 4' to rotate relative to the supporting part 31' around the first shaft part 321' and the first shaft part 312' to uncover the supporting part 31', so that the accommodation space 311' is exposed and the chip can be loaded in the accommodation space 311' of the supporting part 31'. Thereafter, when the force F' against the second portion 42' is stopped, the flexible device 5' connected between the fixing device 3' and the actuating device 4' provides the recovery force to drive the main body 44' and the second portion 42' to rotate relative to the supporting part 31' in the second direction opposite to the first direction. Consequently, the main body 44' drives the linkage 45' and the cover 32' coupled with the linkage 45' rotates relative to the supporting part 31 around the first shaft part 321' and moves toward the direction of covering the supporting part 31' so as to close the accommodation space 311' of the supporting part 31'.

Refers to FIG. 5 again. The main body 44' of the first portion 41' comprises a first concave portion 441'. The first concave portion 441' is concavely formed on the surface of the main body 44'. The opening direction of the first concave portion 441' is toward the cover 32'. One end of the linkage 45' is accommodated with and coupled with the first concave portion 441'. The cover 32' comprises a second concave portion 323'. The concave portion 323' is concavely formed on the surface of the cover 32'. The opening direction of second concave portion 323' is toward the main body 44' of the first portion 41'. The other end of the linkage 45' is accommodated with and coupled with the second concave portion 323'.

Moreover, the linkage 45' comprises a first linkage shaft part 451' and a second linkage shaft part 452'. The first linkage shaft part 451' is pivotally connected with the interconnection of one end of the linkage 45' and the main body 44', so that one end of the linkage 45' is rotated relative to the main body 44' of the first portion 41' around first linkage shaft part 451'. The second linkage shaft part 452' is pivotally connected with the interconnection of the other end of the linkage 45' and the cover 32', so that the other end of the linkage 45' is rotated relative to the cover 32' around the second linkage shaft part 452'. When the force F' is against the forced end 403' to drive the cover 32' to uncover the supporting part 31' so as to expose the accommodation space 311', or when no force is against the forced end 403' or the force F' against the forced end 403' is stopped to drive the cover 32' to cover the supporting part 31', the opposite two ends of the linkage 45' are rotated around the first linkage shaft part 451' and the second linkage shaft part 452' respectively, and relative to main body 44' of the first portion 41' and the cover 32' respectively. Hence, in the case that the force F' is against the forced end 403' to drive the second portion 42' to be rotated by a smaller angle, the cover 32' is rotated by a larger angle and moves toward a direction of uncovering the supporting part 31'. For example, when the force F' is against the forced end 403' to drive the second portion 42' to rotate in the first direction and the rotating angle between the forced end 403' and the second portion 42' is 50 degrees, the cover 32' uncovers the supporting part 31' and the rotating angle between the cover 32' and the supporting part 31' is 90 degrees. In other words, in the case that the forced end 403' is against smaller force F', the cover 32' uncovers the supporting part 31' by larger angle.

In the above embodiment, the flexible device 5' comprises at least one first hook part 50', at least one second hook part 51' and at least one flexible element 52'. As shown in FIG. 5, the two first hook parts 50' are respectively disposed on the opposite two ends of the supporting part 31'. The two second hook parts 51' are disposed on the opposite two sides of the main body 44' of the first portion 41' respectively. Preferably but not exclusively, the two flexible elements 52' are the extension springs. Each flexible element 52' comprises a third hook part 521' and a fourth hook part 522'. The third hook part 521' and the fourth hook part 522' are disposed on the opposite two ends of the corresponding flexible element 52' respectively. Each third hook part 521' is engaged with the corresponding first hook part 50'. Each fourth hook part 522' is engaged with the corresponding second hook part 51'. Therefore, in the case that the force F' is against the second portion 42' to drive the cover 32' to uncover the supporting part 31', once the force F' against the forced end 403' is stopped, the flexible element 52' provides the recovery force to drive the main body 44' of first portion 41' and the second portion 42 coupled with the main body 44' to rotate in the second direction so as to drive the linkage 45' coupled with the main body 44' to rotate. Consequently, the flexible element 52' drives the cover 32' coupled with the linkage 45' to cover the supporting part 31'.

To sum up, the present invention discloses an integrated circuit chip programming apparatus. The integrated circuit chip programming apparatus is a foldable-type integrated circuit chip programming apparatus comprising the cover. Comparing with the traditional pressing integrated circuit chip programming apparatus, the inventive integrated circuit chip programming apparatus is unnecessary to employ a specific pin and has better yield. Moreover, if a plurality of integrated circuit chip programming apparatuses are employed to program the chips automatically and simultaneously, a force is against the actuating devices of the integrated circuit chip programming apparatuses to drive the covers to uncover the supporting parts. Otherwise, when no force is against the actuating devices or the force against the actuating devices is stopped, the actuating devices drive the covers to rotate relative to the supporting parts by the flexible devices so as to cover the supporting parts. Therefore, before the programming operation of the chip is performed by the inventive integrated circuit chip programming apparatus, a force is needed for performing the open operation of the cover and the supporting part, but no force is needed for performing the close operation of the cover and the supporting part. If a plurality of integrated circuit chip programming apparatuses are employed to program the chips automatically, no additional forcing device is needed to cooperate with the integrated circuit chip programming apparatuses. Consequently, the cost is reduced, and the programming operation is simplified.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated circuit chip programming apparatus disposed on a platform and configured to program a chip, the integrated circuit chip programming apparatus comprising:
a fixing device comprising a supporting part and a cover, the supporting part stationarily disposed on the platform and comprising an accommodation space for accommodating the chip therein, wherein one end of the cover is coupled with one end of the supporting part to form a first rotating pivot, and the cover is rotated relative to the supporting part around the first rotating pivot, so that the cover selectively covers or uncovers the supporting part to close or expose the accommodation space of the supporting part;
an actuating device comprising a first connection end, a second connection end and a forced end, wherein the first connection end is coupled with the cover, the second connection end is coupled with the supporting part to form a second rotating pivot, and the actuating device is rotated relative to the supporting part around the second rotating pivot, wherein when a force is against the forced end, the actuating device is rotated relative to the supporting part to drive the cover to expose the accommodation space of the supporting part; and
a flexible device connected between the fixing device and the actuating device, wherein when no force is against the forced end or the force against the forced end is stopped, the flexible device provides a recovery force to allow the actuating device to rotate relative to the supporting part to drive the cover to close the accommodation space of the supporting part.

2. The integrated circuit chip programming apparatus according to claim 1, wherein the cover comprises a first shaft part, the supporting part comprises a first shaft part, and the first shaft part of the cover is pivotally connected with the first shaft part of the supporting part to form the first rotating pivot, wherein an interconnection between the cover and the supporting part is formed as the first rotating pivot, wherein the cover is rotated relative to the supporting part around the first shaft part of the cover and the first shaft part of the supporting part-.

3. The integrated circuit chip programming apparatus according to claim 1, wherein the actuating device comprises a first portion, a second portion and a linking shaft part, a first end of the first portion is coupled with the cover to form the first connection end, a second end of the first portion is coupled with a first end of the second portion and the supporting part, an interconnection between the second end of the first portion and the first end of the second portion forms the second connection end, a second end of the second portion forms the forced end, the linking shaft part is pivotally connected with an interconnection among the first portion, the second portion and the supporting part to form the second rotating pivot, wherein the first portion and the second portion link with each other and are rotated relative to the supporting part around the linking shaft part.

4. The integrated circuit chip programming apparatus according to claim 3, wherein the first portion comprises a first sidewall, a second sidewall and a third sidewall, wherein the first sidewall is opposite to the second sidewall, the third sidewall is connected and disposed between the first sidewall and the second sidewall, wherein the first sidewall, the second sidewall and the third sidewall collectively form a groove structure for receiving at least a portion of the cover, wherein each of the first sidewall and the second sidewall comprises an elongated sliding slot.

5. The integrated circuit chip programming apparatus according to claim 4, wherein the cover comprises a second shaft part pivotally connected with an interconnection between the cover and the first portion, the opposite two ends of the second shaft part are respectively disposed in the corresponding elongated sliding slot, wherein when the first portion is rotated around the linking shaft part, the second shaft part is slidably disposed in the corresponding elongated sliding slot, wherein the opposite two ends of the second shaft part and the elongated sliding slot form a cam structure.

6. The integrated circuit chip programming apparatus according to claim 4, wherein the flexible device comprises two first hook parts, two second hook parts and two flexible elements, wherein the two first hook parts are disposed opposite sides of the supporting part respectively, the two second hook parts are disposed on the first sidewall and the second sidewall respectively, each flexible element comprises a third hook part and a fourth hook part, wherein each third hook part is engaged with a corresponding one of the two first hook parts, wherein each fourth hook part is engaged with a corresponding one of the two corresponding second hook parts, wherein each flexible element is an extension spring.

7. The integrated circuit chip programming apparatus according to claim 1, wherein the actuating device comprises a first portion, a second portion and a linking shaft part, the first portion comprises a main body and a linkage, a first end of the main body is coupled with a first end of the second portion and the supporting part, an interconnection of the first end of the main body and the first end of the second portion form the second connection end, the second connection end is coupled with the supporting part to form the second rotating pivot, a first end of the linkage is coupled with the cover, a second end of the linkage is coupled with a second end of the main body, wherein the first end of the linkage coupled with the cover forms the first connection part, a second end of the second portion forms the forced end, the linking shaft part is pivotally connected with an interconnection among the main body, the second portion and the supporting part, wherein the main body and the second portion link with each other and are rotated relative to the supporting part around the linking shaft part.

8. The integrated circuit chip programming apparatus according to claim 7, wherein the main body comprises a first concave portion, the first concave portion of the main body is concavely formed on a surface of the main body, and the first end of the linkage is accommodated in and coupled with the concave portion of the main body, wherein the cover comprises a concave portion, the concave portion of the cover is concavely formed on a surface of the cover, and the second end of the linkage is accommodated in and coupled with the concave portion of the cover.

9. The integrated circuit chip programming apparatus according to claim 7, wherein the linkage comprises a first linkage shaft part and a second linkage shaft part, the first linkage shaft part is pivotally connected with an interconnection between the first end of the linkage and the main body, wherein the linkage is rotated relative to the main body around the first linkage shaft part, wherein the second linkage shaft part is pivotally connected with an interconnection between the second end of the linkage and the cover, wherein the linkage is rotated relative to the cover around the second linkage shaft part.

10. The integrated circuit chip programming apparatus according to claim 9, wherein when the force is against the forced end to drive the second portion to rotate and a rotating angle between the forced end and the second portion is 50 degrees, the cover uncovers the supporting part and a rotating angle between the cover and the supporting part is 90 degrees.

\* \* \* \* \*